United States Patent [19]
Bronson

[11] Patent Number: 5,770,522
[45] Date of Patent: Jun. 23, 1998

[54] POLISHING BLOCK HEATER

[75] Inventor: Francis Richard Bronson, High Ridge, Mo.

[73] Assignee: MEMC Electronic Materials, Inc., St. Peters, Mo.

[21] Appl. No.: 764,458

[22] Filed: Nov. 12, 1996

[51] Int. Cl.⁶ ..................................................... H01L 21/00
[52] U.S. Cl. ............................. 438/692; 156/345; 216/88; 216/36
[58] Field of Search ........................ 156/345 LP; 216/33, 216/2, 38, 36, 52, 88, 89, 91; 438/691, 692, 747

[56] References Cited

U.S. PATENT DOCUMENTS

| 3,549,439 | 12/1970 | Kaveggia | 156/345 X |
| 5,032,215 | 7/1991 | Dworak et al. | 216/88 X |
| 5,348,615 | 9/1994 | Gupta | 216/88 |

Primary Examiner—William Powell
Attorney, Agent, or Firm—Senniger, Powers, Leavitt & Roedel

[57] ABSTRACT

A method for mounting a semiconductor wafer on a polishing block to hold the semiconductor wafer during polishing. The method comprises the steps of providing a polishing block having a surface for mounting the semiconductor wafer and providing a heater comprising a heater body and a thermally conductive buffer plate which is selectively moveable with respect to the heater body between a pre-heating position in which the plate is spaced from the heater body and a heating position in which the plate contacts the heater body. A bonding agent is applied to the polishing block surface. The polishing block is placed on the buffer plate when the buffer plate is positioned in the pre-heating position and the buffer plate is moved from the pre-heating position to the heating position to heat the buffer plate, the polishing block and the bonding agent. The buffer plate is held in the heating position with the polishing block on the buffer plate for a period of time sufficient to prepare the bonding agent and the semiconductor wafer is applied to the prepared bonding agent.

20 Claims, 4 Drawing Sheets

FIG. 2

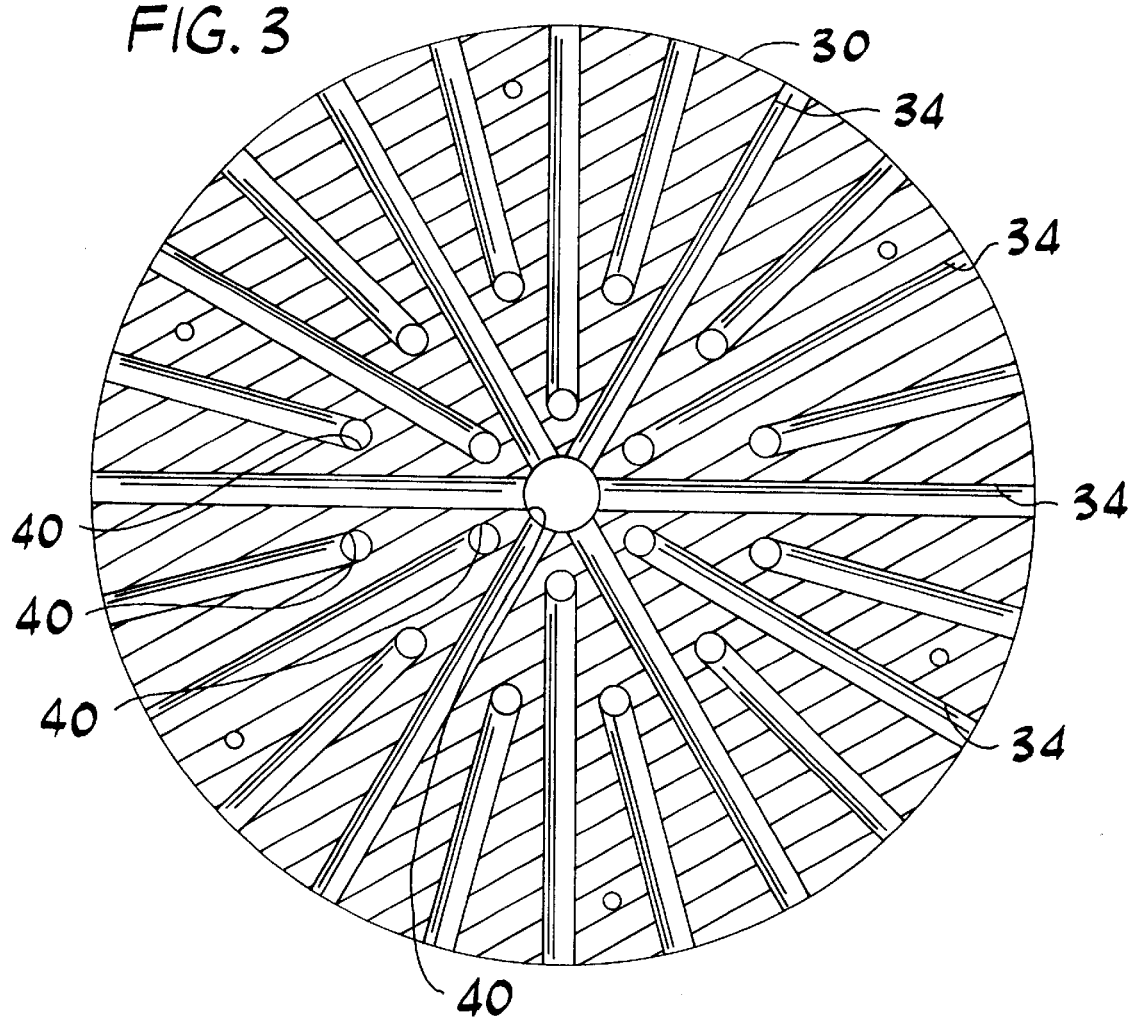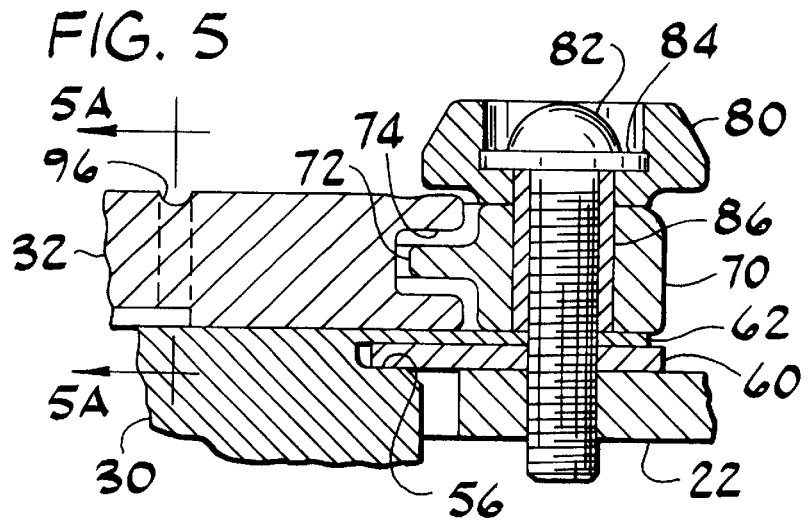

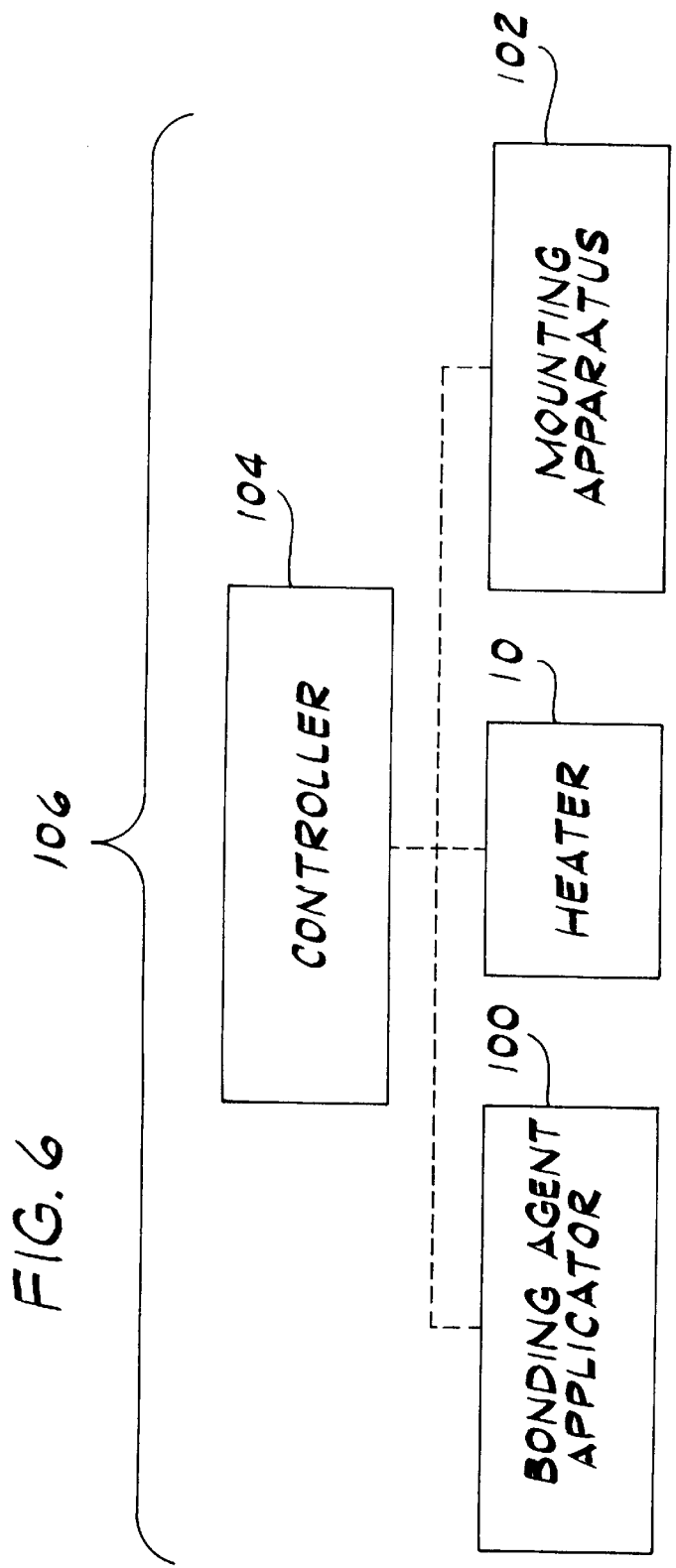
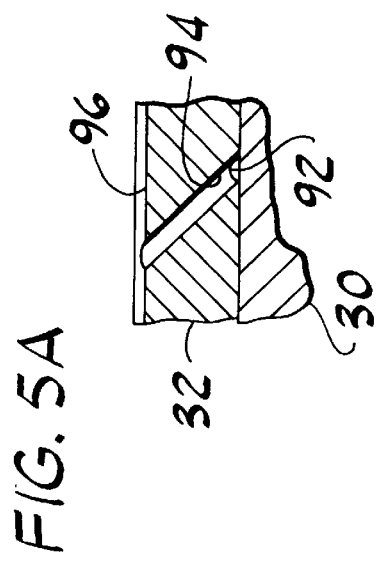

POLISHING BLOCK HEATER

BACKGROUND OF THE INVENTION

This invention relates generally to a method and apparatus for mounting a semiconductor wafer on a polishing block to hold the wafer during polishing. More particularly, the invention relates to a heater for heating the polishing block to prepare a bonding agent applied to the block so a wafer may be temporarily bonded to the block.

The faces of semiconductor wafers are polished during manufacture to provide a very smooth and flat surface. The wafers must be extremely smooth and flat when printing electronic circuits on them by electron beam lithography or photolithography to maintain the resolution of the printed lines which can be as narrow as one micron or less. However, because the wafers are thin, they may flex during the polishing operation if they are not rigidly supported over their entire areas. When the wafers flex, the necessary surface flatness and finish may not be achieved.

To prepare the wafers for polishing, they are mounted on flat polishing blocks using a bonding agent or wax which firmly grips and rigidly supports the wafers. The bonding agent is applied in a thin coat to one face of the polishing block, and the block and agent are heated so the agent dries and becomes sticky. The wafer is pressed against the prepared agent, and as the agent cools, it firmly grips the wafer so the wafer cannot be easily pulled or sheared off the block during the polishing operation. Further, the agent stiffens as it cools to rigidly support the wafer during the polishing operation so the needed surface flatness and finish may be obtained.

Steam pots have been used to heat polishing blocks coated with bonding agents. As its name implies, a steam pot is a vessel containing boiling water. To heat the block, it is seated in an opening at the top of the steam pot so the side of the block opposite the bonding agent is exposed to the steam inside the vessel. The steam heats the block, and the block conducts the heat to the bonding agent. Because the block is cooler than the steam, water condenses on the side of the block exposed to the steam. Although the side of the block having the bonding agent does not face the interior of the steam pot, water will occasionally come in contact with the bonding agent. When water contacts the bonding agent, it becomes pitted which causes small, localized portions of the wafer to be inadequately gripped and supported. Therefore, the block must be dried before further processing to avoid water contact with the bonding agent.

In the past, most bonding agents contained trichlorethylene as a solvent. However, because trichlorethylene has been identified as possibly adversely impacting the environment, other bonding agents which do not contain trichlorethylene have been introduced. For instance, water-based bonding agents have been developed, but these "green" bonding agents do not perform well when heated in steam pots because they are highly water dispersible. Thus, when water droplets contact the agents, large voids occur and the wafers are not adequately supported or gripped.

In an attempt to reduce water splatter the amount of power delivered to the steam pots has been reduced, but this reduces the steam production which increases the time it takes to sufficiently heat the blocks. Longer heating times are undesirable because they increase manufacturing time and cost. To speed up production, stickier bonding agents have been used which reduce the required block temperature so lower power settings and shorter heating times could be used. However, the stickier agents sometimes prevented the wafers from being easily removed from the polishing blocks after polishing, thereby substantially offsetting increases in the rate of production achieved using the stickier bonding agents.

To further overcome the problems associated with steam pots, radiant heaters have been used. However, these heaters are uneconomical to operate because they use large amounts of electrical energy. Resistance heaters have also been used to heat the polishing blocks, but they take a long time to heat up, thereby slowing production times. To avoid the process delays associated with the long heat up times, the blocks have been placed on the radiant heaters while the heaters are hot. However, the polishing blocks are usually brittle and subject to cracking from large internal stresses caused by thermal gradients when the blocks are placed on hot heaters. In addition, if the bonding agent applied to the blocks is heated too fast it can react violently, particularly if it is a water-based agent. When the agent reacts, the block must be removed from production and thoroughly cleaned. To avoid these conditions, pre-heaters have been used to heat the blocks to a lower temperature before placing them on the main heaters. However, these pre-heaters consume additional energy and introduce heat cyclically which tends to cause surface cracks in the bonding agent. When cracks form in the bonding agent, the wafers are not properly supported during polishing.

SUMMARY OF THE INVENTION

Among the several objects of this invention may be noted the provision of a method and apparatus for heating the polishing blocks to quickly and inexpensively prepare bonding agents; the provision of such a method and apparatus in which water-based bonding agents may be used without adversely affecting semiconductor wafer flatness or surface finish; the provision of such a method and apparatus in which polishing blocks are quickly heated without thermally or mechanically shocking the polishing blocks; and the provision of such a method and apparatus in which the polishing blocks, semiconductor wafers and bonding agents do not come in contact with water.

Briefly, one aspect to this invention is a method for mounting a semiconductor wafer on a polishing block to hold the semiconductor wafer during polishing. The method generally comprises the steps of providing a polishing block having a surface for mounting the semiconductor wafer and providing a heater comprising a heater body and a thermally conductive buffer plate which is selectively moveable with respect to the heater body between a pre-heating position in which the plate is spaced from the heater body and a heating position in which the plate contacts the heater body. A bonding agent is applied to the polishing block surface. The polishing block is placed on the buffer plate when the buffer plate is positioned in the pre-heating position and the buffer plate is moved from the pre-heating position to the heating position to heat the buffer plate, the polishing block and the bonding agent. The buffer plate is held in the heating position with the polishing block on the buffer plate for a period of time sufficient to prepare the bonding agent and the semiconductor wafer is applied to the prepared bonding agent.

In another aspect of the invention, the method generally comprises the step of providing a polishing block having a surface for mounting the semiconductor wafer. A bonding agent is applied to the polishing block surface and the polishing block is placed on a cushion of gas maintained above a heater. The cushion of gas is eliminated to lower the polishing block onto the heater thereby to heat the block and prepare the bonding agent, and the semiconductor wafer is applied to the prepared bonding agent.

In yet another aspect, the present invention is apparatus for releasably bonding a semiconductor wafer to a polishing block by heating the block to prepare a bonding agent applied to the block. The apparatus generally comprises a heater body capable of producing sufficient thermal energy to prepare the bonding agent applied to the polishing block and a thermally conductive buffer plate having a first surface for receiving the polishing block and a second surface for engaging the heater body to heat the buffer plate and thereby heat the polishing block. The buffer plate is selectively moveable relative to the heater body between a pre-heating position in which the plate is spaced from the heater body and a heating position in which the plate contacts the heater body.

In still another aspect, the apparatus generally comprises a heater having a surface for receiving the polishing block and a heater body capable of thermal communication with the polishing block when the block is received by the surface. The heater body is capable of producing sufficient thermal energy to prepare the bonding agent applied to the polishing block. The surface has an opening positioned adjacent the polishing block when received by the heater surface. The apparatus also comprises gas moving means for moving gas between the polishing block and the heater surface thereby to affect the thermal conductance between the polishing block and the heater surface.

Other objects and features of the invention will be in part apparent and in part pointed out hereinafter.

BRIEF DESCRIPTION OF THE DRAWINGS

FIG. 2 is a vertical cross section of a heater body, buffer plate and polishing block;

FIG. 3 is a cross section of the heater body taken in the plane of line 3—3 of FIG. 2;

FIG. 5 is a detail vertical cross section similar to FIG. 2 but showing a polishing block centering cap;

FIG. 5A is a detail vertical cross section taken in the plane of line 5A—5A of FIG. 5; and FIG. 6 is a block diagram showing a semiconductor wafer mounting system of the present invention.

Corresponding reference characters indicate corresponding parts throughout the several views of the drawings.

DETAILED DESCRIPTION OF THE PREFERRED EMBODIMENT

Figure 1:
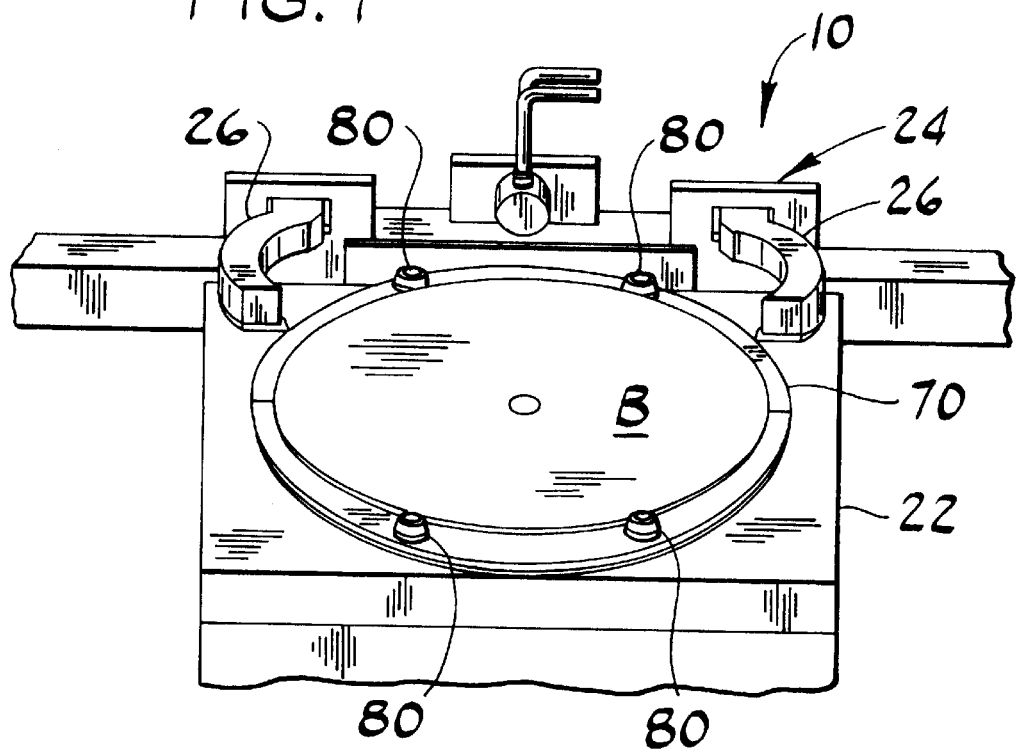
FIG. 1 is a fragmentary perspective of apparatus of the present invention for heating polishing blocks.

Referring now to the drawings and in particular to FIG. 1, heater apparatus of the present invention for heating a polishing block B is indicated in its entirety at 10 to prepare a wax or bonding agent BA (FIG. 2) applied to the upper surface of the polishing block. The heater apparatus 10 comprises a heater 12 (FIG. 2) which is recessed in an opening 20 (FIG. 2) in a stand 22. Although specially designed stands may be used to hold the heater apparatus 10 without departing from the scope of the present invention, the stand 22 of the preferred embodiment is a converted steam pot housing. A conventional robotic transfer system, generally designated 24, is mounted behind and above the stand 22 as shown in FIG. 1 for transporting the polishing block between the heater apparatus 10, a bonding agent applicator and a semiconductor wafer mounting apparatus as will be explained below with respect to FIG. 6. The transfer system 24 includes arms 26 which pivot downward from the position shown and then inward toward each other to grasp a polishing block B. The arms 26 pivot upward with the polishing block B and translate to the left or right as shown in FIG. 1 to transfer the polishing block between stations of the transfer system 24.

Figure 2:
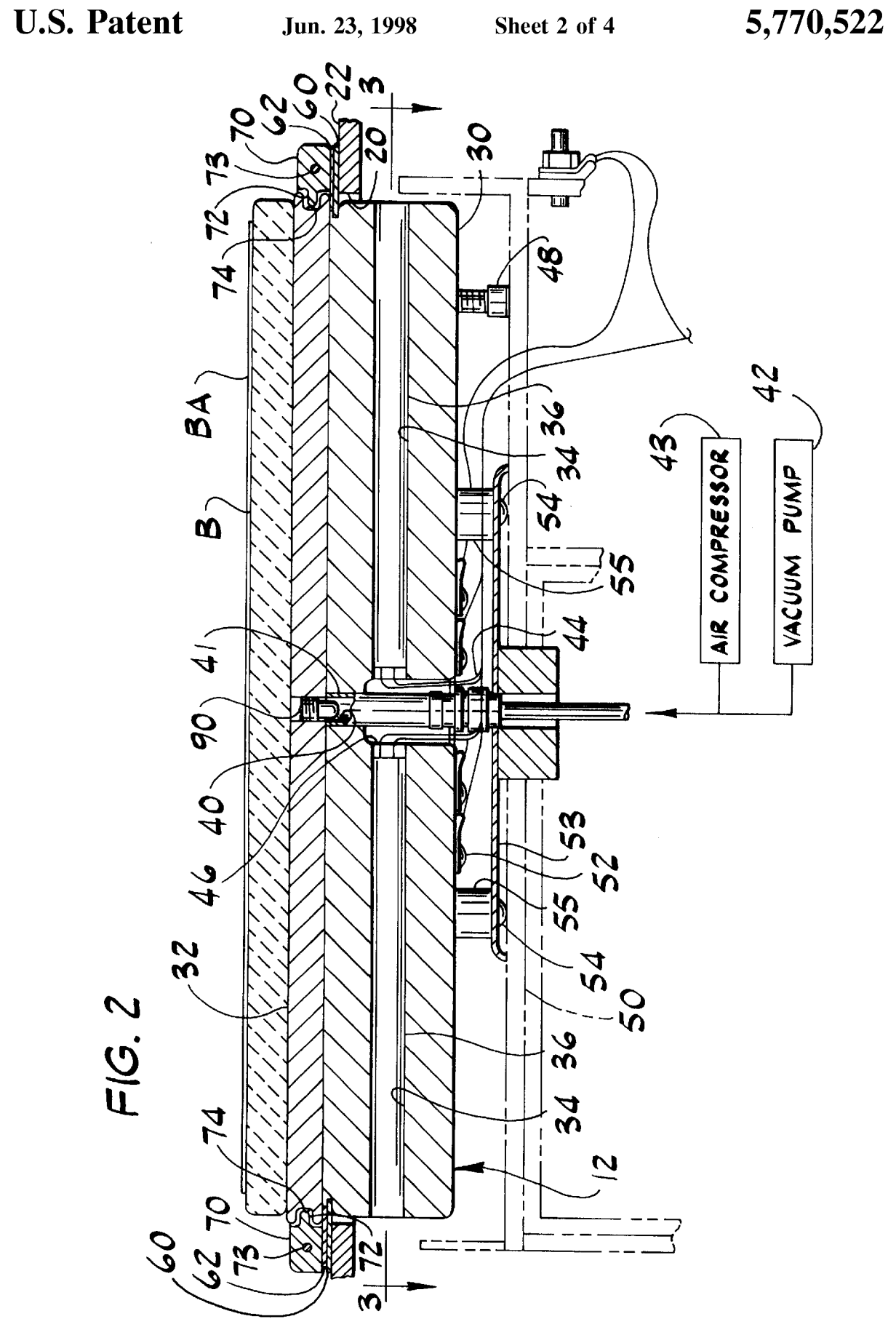

Referring to FIG. 2, the heater 12 includes a circular heater body 30 and a circular buffer plate 32 mounted above the heater body. Various length holes 34 extend radially through the heater body 30 as shown in FIGS. 2 & 3 for accepting cylindrical resistance heater elements 36 (FIG. 2) having lengths corresponding to the lengths of the holes. As shown in FIG. 3, an axial hole 40 extends downward from the radially inner end of each radial hole 34 to the lower surface of the heater body 30. The central, axial hole 40 extends entirely through the heater body 30 for accepting a tubular fitting 41 which conducts gas, such as dry air or nitrogen, through the heater body. The fitting 41 is connected to tubing which leads to a vacuum pump 42 and a compressor 43 for selectively evacuating and pressurizing the gas between the heater body 30 and buffer plate 32. Electrical leads 44 (FIG. 2) extending from the heater elements 36 pass through the axial holes 40 to an external power source (not shown) for providing electricity to the heater elements. An enlarged portion 46 of the central, axially aligned hole 40 provides clearance around the tubular fitting 41 for routing the electrical leads 44 through the heater body 30 from the longer heater elements 36. The heater body 30 of the preferred embodiment is made of MIC6 cast aluminum alloy.

The heater body 30 is mounted on six legs 48 (only one is shown in FIG. 2) which may be independently raised and lowered by rotating them in the heater body to raise, lower and/or level the heater body. The legs 48 rest on a plate 50 in the stand 22 which previously defined a lower side of a plenum for directing steam across the lower surface of a polishing block when the stand was used to house a steam pot. The legs 48 of the preferred embodiment are socket drive cap screws having slots machined across their ends opposite their heads so they may be adjusted from above the heater body 30 when the buffer plate 32 is removed. Thermocouples 52 are connected to the bottom surface of the heater body 30 to sense the temperature of the body and transmit a signal to a controller (not shown) for controlling the operation of the heater apparatus 10. A guard 53 is also mounted to the bottom of the heater body 30 with screws 54 and spacers 55 to prevent damage to the wires extending from the bottom of the heater body when the heater body is removed for maintenance. The upper surface of the heater body 30 is slightly concave (approximately 0.002" lower at the center than at the edge) so a small void is created between the heater body and buffer plate 32. The void permits the buffer plate to seal against the heater body when gas is evacuated from the void through the tubular fitting 41.

As shown in FIG. 5, the upper edge of the heater body perimeter has a land 56 for receiving four insulator segments 60. The segments attach to the top of the stand 22 to center the heater body 30 in the stand opening 20 and to resist conductive heat transfer between the heater body and stand. For manufacturing convenience, each of the segments is formed as a 90° arc. Although other materials having high thermal resistance and temperature capability are envisioned as being within the scope of the present invention, the segments 60 of the preferred embodiment are made of Teflon polymer. Teflon is a federally registered trademark of E. I. du Pont de Nemours & Company of Wilmington, Del. An 18-gauge ring 62 is fastened to the top of the insulator segments 60 to clamp the segments in place on top of the stand 22. Although other materials are envisioned as being within the scope of the present invention, the ring 62 of the preferred embodiment is made of 316 stainless steel to withstand the harsh chemical environment. A collar 70 having an annular ridge 72 extending inward from its inner diameter is mounted on top of the ring 62. For manufacturing convenience, the collar 70 is made in two halves which are joined by pins 73. The ridge 72 is received in an annular groove 74 on the outer diameter of the buffer plate 32 to connect the buffer plate to the stand 22 and heater body 30 while permitting the buffer plate to move with respect to the stand and heater body. The thickness of the ridge 72 is less than the width of the groove 74 so the buffer plate 32 is free to rise off the heater body 30 when the void between the buffer plate and heater body is pressurized.

Returning to FIG. 1, four rotatable caps or bumpers 80 are positioned on top of the collar 70 to center the polishing block B on the buffer plate 32. As shown in FIG. 5, these caps are fastened to the stand 22 with screw fasteners 82. A washer 84 and bushing 86 mounted inside each cap 80 permit the cap to rotate relative to the collar 70. Although other materials are envisioned as being within the scope of the present invention, the caps 80 of the preferred embodiment are made of Rulon polymer material. Rulon is a federally registered trademark of Dixon Industries Corporation of Bristol, R.I.

As further shown in FIG. 2, the buffer plate 32 has a bullet-nose stud 90 screwed into the center of the plate so the bullet nose extends downward from its lower surface. The stud 90 is loosely received by the tubular fitting 41 in the heater body 30 to center the buffer plate 32 within the collar 70. Because the buffer plate 32 is centered by the stud 90, it does not contact the collar 70 when the buffer plate is lowered against the heater body 30. Therefore, conductive heat transfer is eliminated between the buffer plate 32 and the collar 70 when the buffer plate is lowered. Because the stud 90 is loosely received by the fitting 41, gas is permitted to pass between the stud and fitting when pressurizing or evacuating the void between the buffer plate and heater body. In an alternate embodiment, the stud 90 is eliminated and the collar 70 centers the buffer plate 32 on the heater body 30.

Figure 4:
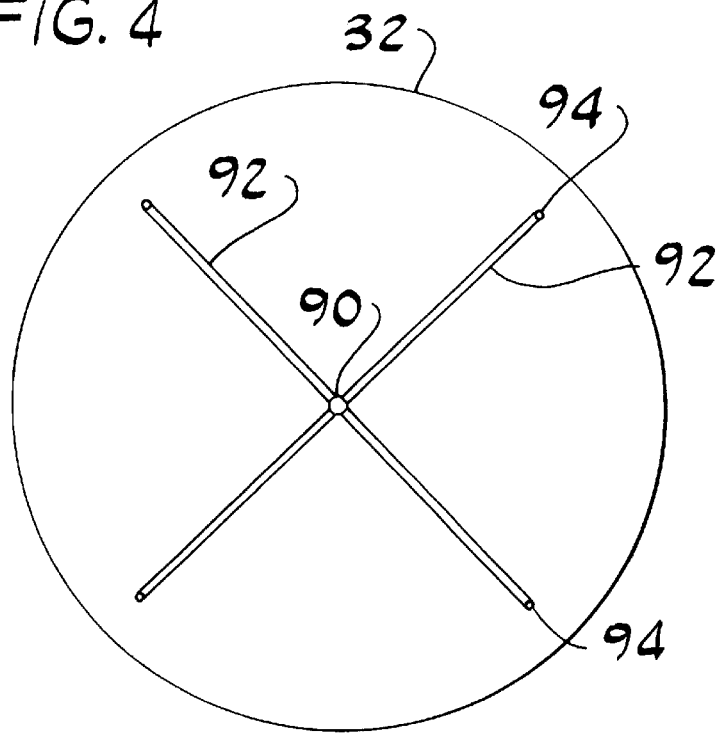
FIG. 4 is a bottom plan view of the buffer plate.

As shown in FIG. 4, four radial channels 92 provided in the bottom surface of the buffer plate 32 xetend outward from the stud 90. As shown in FIG. 5A, holes 94 extend tangentially and obliquely upward from the outer ends of the radial channels 92 to a circumferential groove 96 (FIG. 5) in the upper surface of the buffer plate. The buffer plate of a first preferred embodiment is made of MIC6 cast aluminum alloy and has an anodized coating to protect its exterior surfaces. The anodized coating is black in the preferred embodiment to provide a uniform black surface which does not affect pyrometer readings as will be explained below. The buffer plate of a second preferred embodiment is made of silicon carbide and is not anodized.

In operation, the resistance heater elements 36 are energized to heat the heater body 30 to about 360°–385° F. Gas is blown by the compressor 43 upward through the tubular fitting 41 and past the stud 90 into the void between the heater body and buffer plate 32. Due to the increased gas pressure below the buffer plate 32, it rises off the upper surface of the heater body 30. The collar 70 prevents the buffer plate 32 from rising too far and the stud 90 prevents the plate from drifting to one side of the heater body 30. Because the buffer plate 32 and heater body 30 are not in intimate contact, the conductive thermal resistance between them is increased and the buffer plate is not heated as fast as when the buffer plate is in contact with the heater body. The holes 94 in the buffer plate 32 permit the pressurized gas in the void to travel upward through the plate and out its top. Because the holes 94 extend tangentially, as well as upward, gas passing through the holes urges the buffer plate 32 to slowly rotate about its center to reduce any thermal gradients around the circumference of the buffer plate. The radial channels 92 in the lower surface of the buffer plate 32 permit the gas to pass through the holes 94 when the gas pressure below the plate is insufficient to raise the buffer plate.

After the buffer plate 32 is separated from the heater body 30, the robotic arms 26 lower a polishing block B toward the buffer plate. However, the block B does not contact the buffer plate 32 because jets of gas exiting the top of the buffer plate through holes 94 form a cushion of gas which forces the polishing block off the buffer plate. The caps 80 maintain the block B in position on the plate 32 and prevent the polishing block from drifting off the buffer plate. Because the polishing block B is not in intimate contact with the buffer plate 32, the conductive thermal resistance between the plate and block is increased. Although the block is heated, it is heated at a slow rate compared to prior art resistance heaters. Therefore, the buffer plate 32 is said to be in a pre-heating position when gas is blown upward through the fitting 41 to separate the buffer plate from the heater body 30. In addition, because the polishing block B does not contact the buffer plate 32 when the robotic arms 26 lower it onto the heater 12, the opportunity for mechanical shock due to impact is eliminated. As a result, the polishing blocks processed by the apparatus 10 are unlikely to be chipped or cracked due to thermal or mechanical shock.

After the polishing block B is in place for about three to five seconds on the heater 12 with the buffer plate 32 in the pre-heating position, the vacuum pump 42 is activated to reverse gas flow through the tubular fitting 41 to draw the polishing block, the buffer plate and the heater body toward one another. The vacuum created between the polishing block, buffer plate and heater body urges the respective surfaces towards each other so the thermal resistance across the respective interfaces is reduced (and the thermal conductance is increased). Thus, the heat transfer rate between the heater body 30 and the polishing block B increases. However, depending upon the time it takes to substantially evacuate the gas from the void and passages, significant heat transfer may not occur immediately. When gas is drawn downward through the fitting 41 so the block B and buffer plate 32 are urged downward toward the heater body 30, the buffer plate is said to be in the heating position.

In the preferred embodiment, the temperature of the heater body 30 is sensed with thermocouples 52, and the temperature of the polishing block B is read with a pyrometer (not shown) aimed at the upper surface of the block. Because the heat is only applied to the bottom of the block B by the buffer plate 32 and conduction through the block is not instantaneous, a thermal gradient usually develops through the block. For this reason, the pyrometer may not detect any temperature rise for about ten seconds even though the bottom surface of the block is being heated. About 40 to 50 seconds after the gas is evacuated, the temperature of the top of the polishing block B rises from room temperature to about 185° F. to 195° F. When the temperature sensed by the pyrometer reaches this range, gas flow through the fitting 41 is reversed again so the buffer plate 32 is separated from the heater body 30 and the block B is separated from the buffer plate. Because the temperature of the lower surface of the block B is greater than that of the upper surface when the block is initially separated from the heater 12, the temperature of the polishing block at its upper surface continues to increase as the temperature gradient through the block equalizes. Although heating times may vary depending upon many parameters, the apparatus 10 of the present invention has been found to reliably heat conventional polishing blocks to the temperature required to prepare the bonding agent BA in less than about one minute without subjecting the blocks to mechanical or thermal shock and without using a significant amount of energy.

The previously described process parameters including the times and temperatures are given as examples and are not meant to limit the scope of the invention defined by the claims below. The parameters will vary depending upon numerous factors including the thickness and composition of the polishing blocks B to be heated.

As shown in FIG. 6, the heater apparatus 10 may be used in combination with a bonding agent applicator 100 for applying a releasable bonding agent BA to a surface of a polishing block, a mounting apparatus 102 for mounting a first face of a semiconductor wafer to the polishing block surface, and a controller 104 for controlling operation of the bonding agent applicator, the heater apparatus, and the mounting apparatus. Together the heater apparatus 10, bonding agent applicator 100, mounting apparatus 102 and controller 104 constitute a mount station 106 for mounting semiconductor wafers on polishing blocks. Alternatively, the mount station 106 may take the form disclosed in co-assigned U.S. patent application Ser. No. 08/242,560, filed May 13, 1994, entitled, "Semiconductor Wafer Polishing Apparatus and Method".

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method for mounting a semiconductor wafer on a polishing block to hold the semiconductor wafer during polishing, the method comprising the steps of:
    providing a polishing block having a surface for mounting the semiconductor wafer thereon;
    providing a heater comprising a heater body and a thermally conductive buffer plate selectively moveable with respect to the heater body between a pre-heating position in which the plate is spaced from the heater body and a heating position in which the plate contacts the heater body;
    applying a bonding agent to the polishing block surface;
    placing the polishing block on the buffer plate when the buffer plate is positioned in the pre-heating position;
    moving the buffer plate from the pre-heating position to the heating position to heat the buffer plate, the polishing block and the bonding agent;
    holding the buffer plate in the heating position with the polishing block on the buffer plate for a period of time sufficient to prepare the bonding agent; and
    applying the semiconductor wafer to the prepared bonding agent.

2. A method as set forth in claim 1 further comprising the step of removing gas between the buffer plate and the heater body when the buffer plate is positioned in the heating position to thereby increase the thermal conductance between the heater body and the buffer plate.

3. A method as set forth in claim 1 further comprising the step of urging the polishing block against the buffer plate to thereby increase the thermal conductance between the buffer plate and the polishing block.

4. A method as set forth in claim 3 wherein the step of urging the polishing block against the buffer plate comprises the step of removing gas between the polishing block and the buffer plate when the polishing block is positioned on the buffer plate.

5. A method as set forth in claim 1 further comprising the steps of:
    blowing gas through the buffer plate to develop a cushion of gas between the polishing block and the buffer plate when the polishing block is placed on the buffer plate; and
    stopping gasflow through the buffer plate to eliminate the gas cushion when the buffer plate is moved to the heating position to lower the polishing block onto the buffer plate to thereby increase the thermal conductance between the buffer plate and the polishing block.

6. A method for mounting a semiconductor wafer on a polishing block to hold the semiconductor wafer during polishing, the method comprising the steps of:
    providing a polishing block having a surface for mounting the semiconductor wafer thereon;
    applying a bonding agent to the polishing block surface;
    placing the polishing block on a cushion of gas maintained above a heater;
    eliminating the cushion of gas to lower the polishing block onto the heater thereby to heat the block and prepare the bonding agent; and
    applying the semiconductor wafer to the prepared bonding agent.

7. Apparatus for releasably bonding a semiconductor wafer to a polishing block by heating the block to prepare a bonding agent applied to the block, the apparatus comprising:
    a heater body capable of producing sufficient thermal energy to prepare the bonding agent applied to the polishing block; and
    a thermally conductive buffer plate having a first surface for receiving the polishing block and a second surface for engaging the heater body to heat the buffer plate and thereby heat the polishing block, the buffer plate being selectively moveable relative to the heater body between a pre-heating position in which the plate is spaced from the heater body and a heating position in which the plate contacts the heater body.

8. Apparatus as set forth in claim 7 further comprises a compressor for forcing gas between the heater body and the buffer plate to move the buffer plate to the pre-heating position for reducing thermal shock to the polishing block when initially received by the buffer plate.

9. Apparatus as set forth in claim 8 further comprising means for urging the buffer plate against the heater body to thereby increase the thermal conductance between the heater body and the buffer plate.

10. Apparatus as set forth in claim 9 wherein said urging means comprises a vacuum pump for removing gas between the buffer plate and the heater body.

11. Apparatus as set forth in claim 8 wherein said buffer plate first surface has an opening positioned adjacent the polishing block when the block is received by said first surface, and the compressor forces gas through the opening to produce a cushion of gas between the buffer plate and the polishing block for reducing thermal shock and mechanical shock to the polishing block when initially received by said buffer plate first surface.

12. Apparatus as set forth in claim 11 further comprising means for urging the polishing block against the buffer plate when the polishing block is received by said buffer plate first surface to thereby increase the thermal conductance between the buffer plate and the polishing block.

13. Apparatus as set forth in claim 12 wherein said urging means comprises a vacuum pump for drawing gas through the opening to remove gas between the polishing block and the buffer plate when the polishing block is received by said buffer plate first surface.

14. Apparatus as set forth in claim 7 wherein the heater body includes a resistance heater element embedded in the body for heating the heater body.

15. Apparatus as set forth in claim 7 in combination with:
  a bonding agent applicator for applying a releasable bonding agent to a surface of a polishing block;
  a mounting apparatus for mounting a first face of a semiconductor wafer on the polishing block surface; and
  a controller for controlling operation of the bonding agent applicator, the heater, and the mounting apparatus.

16. Apparatus for releasably bonding a semiconductor wafer to a polishing block by heating the block to prepare a bonding agent applied to the block, the apparatus comprising:
  a heater having a surface for receiving the polishing block and a heater body capable of thermal communication with the polishing block when the block is received by the surface, the heater body being capable of producing sufficient thermal energy to prepare the bonding agent applied to the polishing block, the surface having an opening positioned adjacent the polishing block when received by the heater surface; and
  gas moving means for moving gas between the polishing block and the heater surface thereby to affect the thermal conductance between the polishing block and the heater surface.

17. Apparatus as set forth in claim 16 wherein said gas moving means comprises a compressor for selectively forcing gas through the heater opening to separate the polishing block from the heater to reduce thermal shock and mechanical shock to the polishing block when initially received by the heater surface.

18. Apparatus as set forth in claim 16 wherein said gas moving means comprises a vacuum pump for drawing gas through the heater opening to remove gas between the polishing block and the heater surface to thereby increase the thermal conductance between the heater surface and the polishing block.

19. Apparatus as set forth in claim 18 further comprising a thermally conductive buffer plate including the heater surface thereon and another surface engageable with the heater body to heat the buffer plate and thereby heat the polishing block, the buffer plate being selectively moveable relative to the heater body between a pre-heating position in which the plate is spaced from the heater body and a heating position in which the plate contacts the heater body.

20. Apparatus as set forth in claim 19 wherein said gas moving means comprises a vacuum pump for drawing gas through the heater opening to remove gas between the polishing block and the heater surface to thereby increase the thermal conductance between the heater surface and the polishing block.

* * * * *